(12) United States Patent
Sakamoto (10) Patent No.: US 9,894,812 B2
(45) Date of Patent: Feb. 13, 2018

(54) INVERTER CASE

(71) Applicant: TOYOTA JIDOSHA KABUSHIKI KAISHA, Toyota-shi, Aichi-ken (JP)

(72) Inventor: Yusuke Sakamoto, Okazaki (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 46 days.

(21) Appl. No.: 14/902,172

(22) PCT Filed: Jun. 27, 2014

(86) PCT No.: PCT/IB2014/001221
§ 371 (c)(1),
(2) Date: Dec. 30, 2015

(87) PCT Pub. No.: WO2015/001408
PCT Pub. Date: Jan. 8, 2015

(65) Prior Publication Data
US 2016/0374235 A1    Dec. 22, 2016

(30) Foreign Application Priority Data

Jul. 1, 2013   (JP) ................................ 2013-137826

(51) Int. Cl.
*H05K 7/20* (2006.01)
*B60K 6/405* (2007.10)
*H01L 23/473* (2006.01)

(52) U.S. Cl.
CPC ......... *H05K 7/20872* (2013.01); *B60K 6/405* (2013.01); *H01L 23/473* (2013.01); *H05K 7/20927* (2013.01)

(58) Field of Classification Search
CPC ........................... H05K 7/20927; B60K 6/405
See application file for complete search history.

(56) References Cited

U.S. PATENT DOCUMENTS

| 8,472,188 B2* | 6/2013 | Horiuchi | ............ H05K 7/20927 165/80.4 |
| 8,848,370 B2* | 9/2014 | Shin | ...................... H02M 7/003 165/104.33 |

(Continued)

FOREIGN PATENT DOCUMENTS

| DE | 3908996 A1 | 9/1990 |
| DE | 112009000022 T5 | 7/2010 |

(Continued)

*Primary Examiner* — Robert J Hoffberg
(74) *Attorney, Agent, or Firm* — Sughrue Mion, PLLC (57) ABSTRACT

An inverter case is provided on a transaxle of a vehicle so as to be inclined downward toward a vehicle front side, and the inverter case includes: a refrigerant passage connection portion provided on a front side surface of the inverter case in a longitudinal direction of the vehicle, the refrigerant passage connection portion having a shaft seal structure; a refrigerant passage member disposed on the front side surface of the inverter case and connected to the refrigerant passage connection portion by the shaft seal structure; and a projecting portion provided on an upper part of the front side surface of the inverter case, the projecting portion being configured such that a front side end of the projecting portion is placed at the vehicle front side relative to a front side end of the refrigerant passage member in the longitudinal direction of the vehicle.

4 Claims, 6 Drawing Sheets

(56) References Cited

U.S. PATENT DOCUMENTS

| | | | |
|---|---|---|---|
| 8,953,353 B2* | 2/2015 | Sasayama | H02M 7/003 |
| | | | 361/699 |
| 9,205,749 B2* | 12/2015 | Sakamoto | B60K 1/00 |
| 9,565,792 B2* | 2/2017 | Ishikawa | H05K 7/20927 |
| 9,587,769 B2* | 3/2017 | Ishikawa | F16L 5/12 |
| 2006/0201753 A1 | 9/2006 | Yamafuji | |
| 2009/0206709 A1 | 8/2009 | Kakuda et al. | |
| 2010/0208427 A1* | 8/2010 | Horiuchi | H05K 7/20927 |
| | | | 361/699 |
| 2013/0039009 A1* | 2/2013 | Shin | H02M 7/003 |
| | | | 361/699 |
| 2013/0206375 A1 | 8/2013 | Yoshida | |
| 2013/0220719 A1 | 8/2013 | Kobayashi | |
| 2014/0140118 A1* | 5/2014 | Ishikawa | H05K 7/20927 |
| | | | 363/141 |
| 2017/0067589 A1* | 3/2017 | Ishikawa | F28F 9/26 |

FOREIGN PATENT DOCUMENTS

| | | | |
|---|---|---|---|
| DE | 112011104946 T5 | | 11/2013 |
| JP | 2003273302 A | * | 9/2003 |
| JP | 2006-248313 A | | 9/2006 |
| JP | 2009-201218 A | | 9/2009 |
| JP | 2010-006257 A | | 1/2010 |
| JP | 2011-152828 A | | 8/2011 |
| JP | 2012-042010 A | | 3/2012 |
| JP | 2012-064724 A | | 3/2012 |
| JP | 2013-103587 A | | 5/2013 |
| JP | 2014-102017 A | | 6/2014 |
| WO | 2012/086058 A1 | | 6/2012 |

* cited by examiner

INVERTER CASE

BACKGROUND OF THE INVENTION

1. Field of the Invention

The present invention relates to an inverter case, and particularly, relates to an inverter case provided in a transaxle of a vehicle.

2. Description of Related Art

Conventionally, there has been known such a configuration that an inverter case is provided on a transaxle configured such that a motor, a transmission, and so on are integrally incorporated within a case, in a hybrid vehicle. When the inverter case is provided on the transaxle as such, a distance between the inverter and the motor is shortened. This advantageously makes it possible to easily arrange a power cable for connecting the inverter and the motor and to shorten a cable length.

For example, Japanese Patent Application Publication No. 2009-201218 (hereinafter referred to as JP 2009-201218 A) describes a hybrid driving device in which an inverter case accommodating an inverter therein is attached onto a transaxle so, as to be inclined downward toward a front direction in terms of a vehicle longitudinal direction. JP 2009-201218 A shows that, in the inverter case of the hybrid driving device, a refrigerant passage through which refrigerant such as cooling water or coolant circulates and flows is formed, and a conduit line for the refrigerant flowing through the refrigerant passage is provided in a projecting manner on a side wall portion of the inverter case on a vehicle front side.

In the meantime, in the inverter case of the hybrid vehicle or the like, a shaft seal structure is applied to the refrigerant conduit line placed on the vehicle front side so as to connect a refrigerant passage member thereto. Here, the "shaft seal structure" is a seal structure that allows the refrigerant passage member connected to the conduit line to move its axis direction, and secures a sealing state of a connection portion between the inverter case and the refrigerant passage member.

In the inverter case attached to be inclined downward toward the vehicle front side, in a case where the refrigerant passage member to which such a shaft seal structure is applied is provided on the side wall surface of the inverter case on the vehicle front side, when a front collision of the vehicle occurs, vehicle component parts such as a radiator and a hood placed closer to a front side of the inverter case move rearward so as to make contact with the inverter case, which highly possibly causes a collision load to be input into the inverter case.

In that case, if the refrigerant passage member employing the above shaft seal structure is connected to the front side wall surface of the inverter case, the refrigerant passage member that has received the collision load penetrates into the inverter case, which may damage the inverter inside the inverter case.

SUMMARY OF THE INVENTION

The present invention provides an inverter case that is able to restrain damage of an inverter due to penetration of a refrigerant passage member having a shaft seal structure into an inverter case at the time of a vehicle front collision.

An inverter case according to an aspect of the, present invention is provided on a transaxle of a vehicle so as to be inclined downward toward a vehicle front side, and the inverter case includes: a refrigerant passage connection portion provided on a front side surface of the inverter case in a longitudinal direction of the vehicle, the refrigerant passage connection portion having a shaft seal structure; a refrigerant passage member disposed on the front side surface of the inverter case and connected to the refrigerant passage connection portion by the shaft seal structure; and a projecting portion provided on an upper part of the front side surface of the inverter case, the projecting portion being configured such that a front side end of the projecting portion is placed at the vehicle front side relative to a front side end of the refrigerant passage member in the longitudinal direction of the vehicle.

In the inverter case according to the aspect of the present invention, the refrigerant passage member may be configured to introduce, into the inverter case, refrigerant flowing outside from the inverter case.

In the inverter case according to the aspect of the present invention, an outside diameter of the refrigerant passage member connected to the refrigerant passage connection portion may be smaller than an inside diameter of a refrigerant passage pipe provided inside the inverter case and the refrigerant passage pipe being connected to the refrigerant passage connection portion.

In the inverter case according to the aspect of the present invention, a position of the front side end of the projecting portion may be generally aligned with a position of a front side end of the transaxle when viewed from a vertical direction.

According to the inverter case of the aspect of the present invention, when a front collision of the vehicle occurs, the projecting portion of the inverter case makes contact with a vehicle component part provided in front of the inverter case before the refrigerant passage member does, thereby receiving an impact. This makes it possible to restrain damage of the refrigerant passage member using a shaft seal structure and penetration of the refrigerant passage member into the inverter case.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

The following describes an embodiment of the present invention in detail with reference to the attached drawings.

In this description, specific shapes, materials, values, directions, and the like are examples to facilitate understanding of the present invention, and can be modified appropriately in conformity to a purpose, an object, a specification, and the like. Further, in a case where the following description includes a plurality of embodiments or modified embodiments, it is assumed from the first that features of them are used in combination appropriately.

The following description deals with a case where a vehicle in which an inverter case is provided is a hybrid vehicle including an engine and a motor generator (hereinafter just referred to as a motor). However, the vehicle is not limited to this, and may be applied to an electric vehicle including only a motor as a drive power source. Further, one or more motors may be provided in the vehicle. In a case where two motors are provided, one of the motors may be mainly used to output a drive power, and the other one may be mainly used as a generator for generating an electric power by receiving an engine power.

Figure 1:
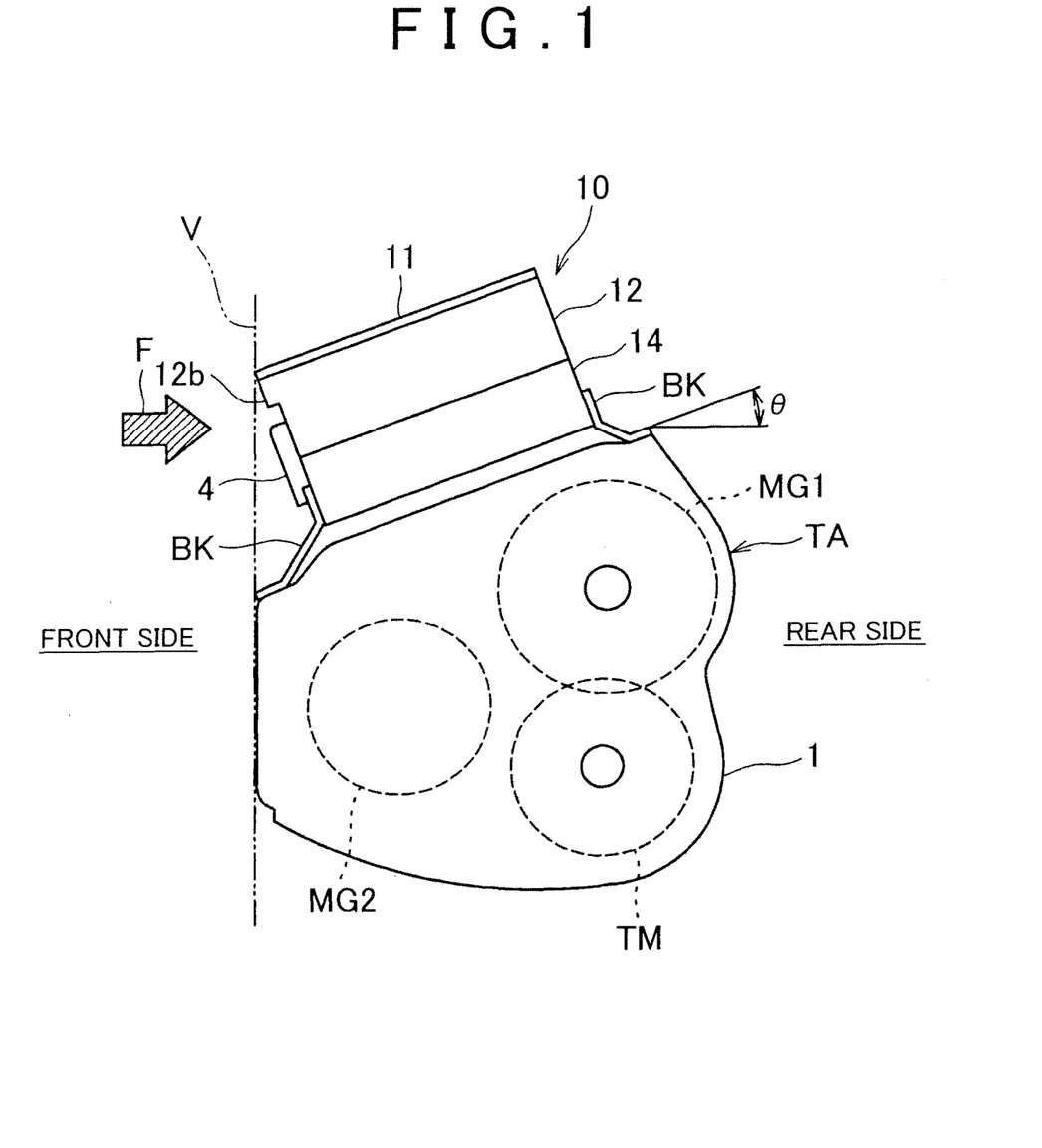
FIG. 1 is a side view illustrating an inverter case provided on a transaxle so as to be inclined downward toward a vehicle front side.

FIG. 1 is a side view illustrating a state where an inverter case 10 of the present embodiment is provided on a transaxle TA of the hybrid vehicle so as to be inclined downward toward a vehicle front side. In FIG. 1, the left side is the vehicle front side, and the right side is a vehicle rear side.

As illustrated in FIG. 1, the transaxle TA of the hybrid vehicle is configured such that a motor MG1 mainly used as a generator, a motor MG2 mainly used as a generator, and a transmission TM for transmitting outputs of the motors MG1, MG2 to an axle are accommodated in a transaxle case 1 in an integrated manner. The transaxle case 1 is formed by casting a metallic material such as aluminum, for example. Further, in that engine compartment of the hybrid vehicle in which the transaxle TA is provided, an engine (not shown) is provided adjacent to the transaxle TA.

The inverter case 10 is fixed onto the transaxle case 1 constituting the transaxle TA, via brackets BK. The brackets BK used herein may be those made from a sheet metal, for example. Although not illustrated herein, the brackets BK are each fastened and fixed to the inverter case 10 and the transaxle case 1 via bolts. Note that the present embodiment deals with an example in which the brackets BK are members different from the inverter case 10, but the brackets BK may be formed from the same material as the inverter case 10 by integral molding.

The inverter case 10 is attached in such a posture that the inverter case 10 is inclined downward toward the vehicle front side. More specifically, a tabular cover 11 serving as a top surface of the inverter case 10 is attached in a state where the tabular cover 11 forms an angle θ with respect to a horizontal direction. Here, the angle θ is set to 20 degrees, for example.

Further, as illustrated by an alternate long and two short dashes line V in FIG. 1, a position of a vehicle front side end of the inverter case 10 is generally aligned with a position of a vehicle front side end of the transaxle TA in a vertical direction. Here, to be "generally aligned" includes not only a case where the vehicle front side end of the inverter case 10 is completely aligned with the vehicle front side end of the transaxle TA in the vertical direction, but also a case where the front side end of the inverter case 10 is placed slightly at a vehicle rear, side relative to the transaxle TA. With such a configuration, in a case where that vehicle component part such as a radiator (not shown) which is placed in front of the inverter case 10 and the transaxle TA so as to be adjacent thereto moves rearward at the time of a front collision of the vehicle, the vehicle component part makes contact with the transaxle TA having a high rigidity so that an impact F is received. This makes it possible to restrain damage of the inverter case 10 and a refrigerant passage member provided on its front side surface. Details of a shape of the inverter case 10 will be described later.

Figure 2:
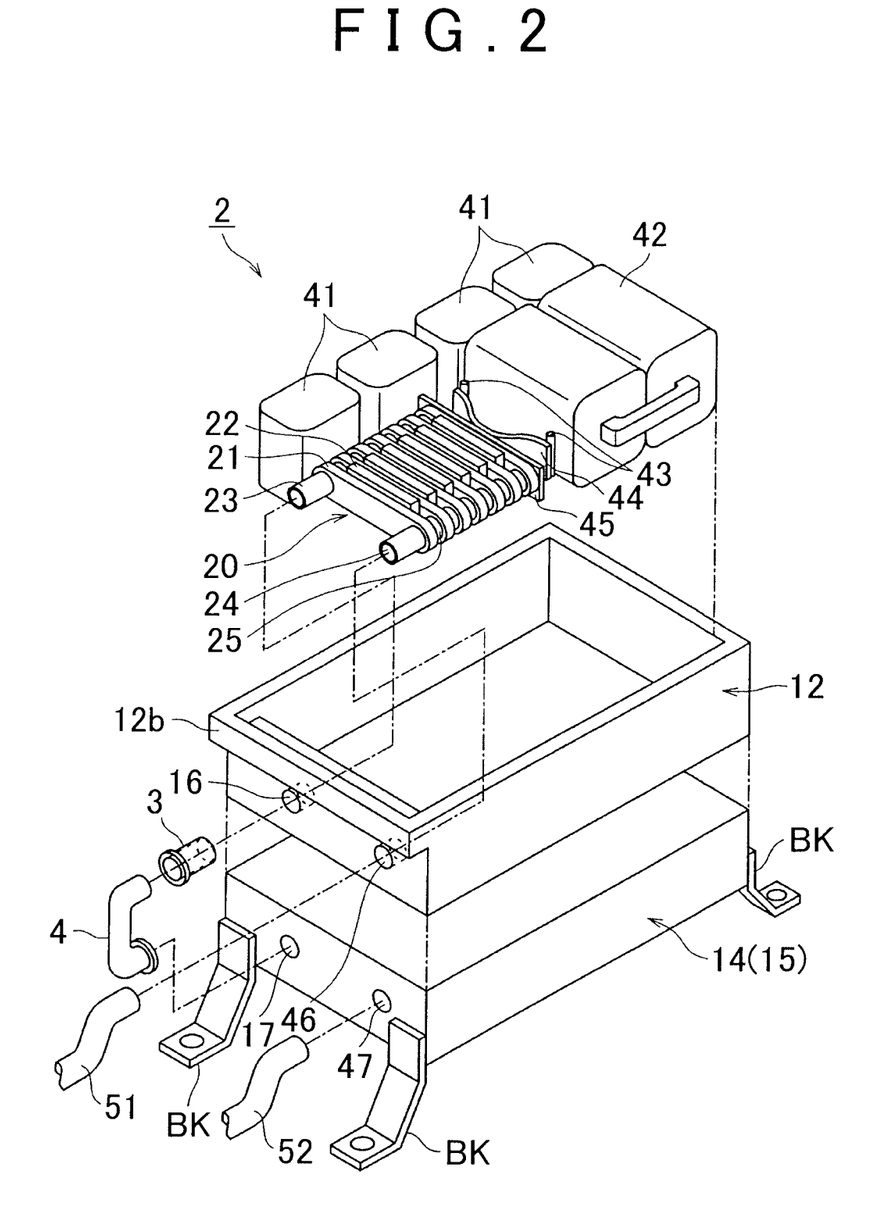
FIG. 2 is an exploded perspective view of an inverter accommodated in the inverter case.
Figure 3:
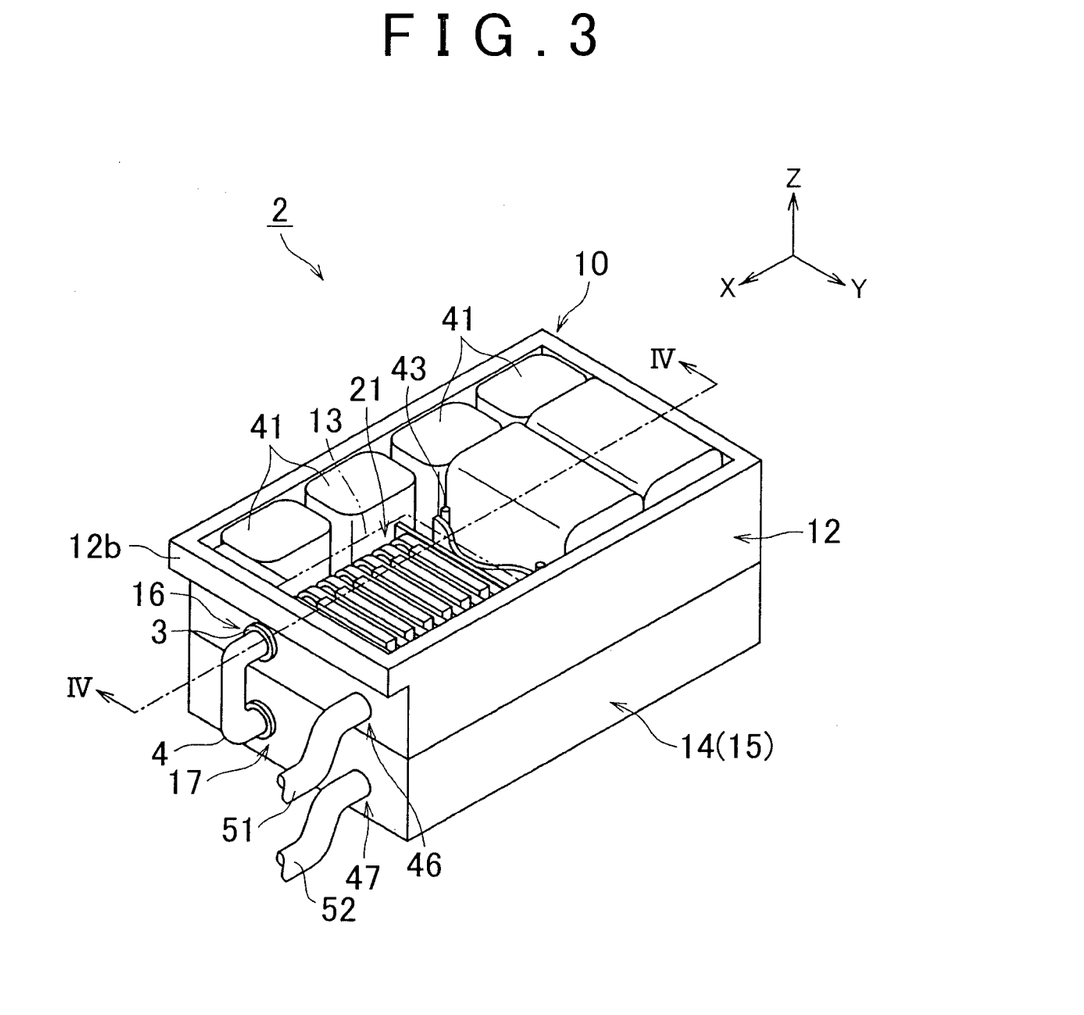
FIG. 3 is a perspective view illustrating a state where the inverter and so on are accommodated in the inverter case.
Figure 4:
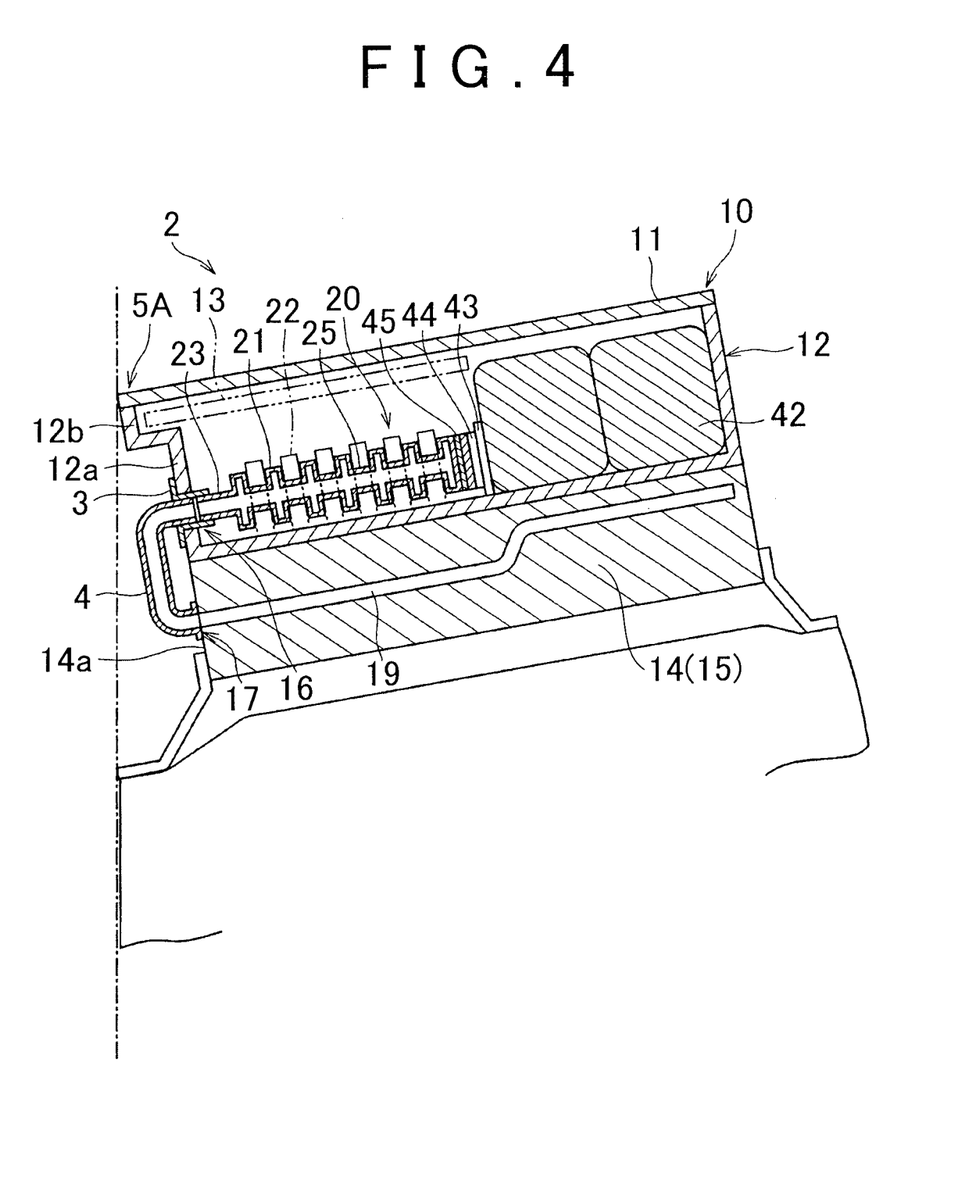
FIG. 4 is a sectional view taken along a line IV-IV in FIG. 3.

FIG. 2 is an exploded perspective view of an inverter 2 to be accommodated in the inverter case 10, and FIG. 3 is a perspective view illustrating a state where the inverter 2 is accommodated in the inverter case 10. Note that the cover 11 of the inverter case 10 is not illustrated herein for facilitation of understanding. Further, FIG. 4 is a sectional view taken along a line IV-IV in FIG. 3.

The inverter 2 to be accommodated in the inverter case 10 is an electric-power converter which is provided in the hybrid vehicle and which boosts a direct-current power of a battery and then converts it to an alternating-current power suitable to drive the drive motor MG2. The inverter 2 is formed in combination of a voltage boost converter circuit and an inverter circuit in terms of a circuit. In terms of hardware, the inverter 2 is mainly constituted by: a double-wall construction cooling unit 20 for cooling off switching elements (a transistor such as an IGBT, and a diode connected in reverse-parallel to the transistor) provided integrally therein; a smoothing capacitor 41 for smoothing a heavy-current for motor drive; a reactor 42 used for the voltage boost converter circuit; a cooler 15 for cooling off the reactor 42 and the smoothing capacitor 41; and a circuit substrate 13 (see FIG. 3) including a control circuit for controlling the switching-elements. Note that the circuit substrate 13 is disposed above the double-wall construction cooling unit 20 and the reactor 42, but is not illustrated in FIG. 2. Further, FIG. 3 illustrates a state where the cover 11 is removed, so as to make it easy to understand a layout in the inverter case 10.

The inverter 2 includes two independent housings, i.e., a first housing 12 and a second housing 14. The first housing houses therein the reactor 42, the double-wall construction cooling unit 20, and so on, and the second housing 14 is the cooler 15 itself. The inverter 2 includes two types of coolers. One of the coolers is the cooler 15 for cooling off the reactor 42 and the smoothing capacitor 41, and the other one is the double-wall construction cooling unit 20 formed integrally with a plurality of power cards 22 in each of which a switching element is accommodated. Since the cooler 15 is fixed to a bottom face of the first housing 12, the inverter 2 includes these coolers in an integrated manner as a whole.

The double-wall construction cooling unit 20 is configured such that the plurality of power cards 22 each formed by molding a switching element therein, and a plurality of tabular cooling plates 21 in each of which refrigerant flows are laminated alternately. Here, it is possible to use cooling water as the refrigerant, for example. However, coolant, cooling oil, coolant gas, and the like except for the cooling water may be also used as the refrigerant.

An inside of the cooling plate 21 is hollow, and a through hole is provided on either side of the cooling plate 21 in its longitudinal direction (that is, both sides of the power card 22). The through holes of the cooling plates 21 adjacent to each other are connected to each other via a connecting pipe 25. Further, two tubes (refrigerant passage pipes inside the case) 23, 24 made from a rigid body are connected to the cooling plate 21 placed at an end of the laminated structure. The double-wall construction cooling unit 20 is housed in the first housing 12, and the tubes 23, 24 are inserted into openings 16, 46 provided on a side wall of the first housing 12. The refrigerant is supplied to the double-wall construction cooling unit 20 via one opening 46, and the refrigerant is discharged from the double-wall construction cooling unit 20 via the other opening 16. A supply pipe 51 for supplying the refrigerant is connected to the one opening 46 from outside the case, and one tube 24 is connected thereto inside the case. The other tube 23 is connected to the other opening 16 inside the case, and a first connecting pipe 3 and a second connecting pipe 4 are connected thereto outside the case.

The second connecting pipe 4 can be constituted by a U-shaped pipe. That is, the second connecting pipe 4 constitutes a turned portion for introducing the refrigerant flowing outside the case from, the first housing 12 of the inverter case 10 into the second housing of the inverter case 10 again. One end (a lower end in FIGS. 2, 3) of the second connecting pipe. 4 is connected to an opening 17 of the second housing 14. Further, another opening 47 is formed in the second housing 14, and a refrigerant discharge pipe 52 is connected thereto.

The refrigerant supplied from an outside of the inverter 2 via the refrigerant supply pipe 51 is supplied to the double-wall construction cooling unit 20 via the opening 46 and the one tube 24. The refrigerant flowing from the tube 24 goes around all the cooling plates 21 via the connecting pipes 25 connected to the cooling plates 21 on one side thereof. The refrigerant flows inside the cooling plates 21 in a longitudinal direction thereof and cools off the power cards 22 making contact with the cooling plates 21. The refrigerant that absorbs heat of the power cards 22 passes through the connecting pipes 25 connected to the cooling plates 21 on the other sides thereof, and discharged from the first housing 12 via the tube 23 and the opening 16. The refrigerant is then introduced into the second housing, that is, the cooler 15 via the first connecting pipe 3 and the second connecting pipe 4. Inside the second housing 14, a passage 19 (see FIG. 4) for the refrigerant is provided at a position right under the reactor 42 and a capacitor 41 provided in the first housing 12. While the refrigerant passes through the passage 19, the refrigerant cools off the reactor 42 and the capacitor 41. The refrigerant is eventually discharged from the refrigerant discharge pipe 52 connected to the opening 47. Note that a cooling system including a radiator for cooling off the refrigerant and a pump for circulating the refrigerant is provided outside the inverter 2, and the refrigerant that has cooled off the inverter 2 is cooled down by the radiator, and then sent to the inverter case 10 again.

The double-wall construction cooling unit 20 is configured such that an insulating plate 45 and a leaf spring 44 are further laminated on one end of a laminated body thereof, and is biased by the leaf spring 44 supported by a strut 43 provided in a standing manner in a bottom of the first housing 12. Hereby, the double-wall construction cooling unit 20 is supported by the first housing 12, while a load is added thereto in a laminating direction thereof. Due to the load of the leaf spring 44, the cooling plates 21 and the power cards 22 laminated alternately make close contact with each other, so that heat is transmitted well therebetween.

The inverter 2 includes two independent housings, i.e., the first housing 12 and the second housing 14, and the openings 16, 46, 17, 47 through which the refrigerant passes are provided in the housings 12, 14. The opening 16 of the first housing 12 is connected to the opening 17 of the second housing 14 via the first connecting pipe 3 and the second connecting pipe 4. Note that seal members are provided in a connection portion between the first connecting pipe 3 and the opening 16, a connection portion between the first connecting pipe 3 and the tube, a connection portion between the first connecting pipe 3 and the second connecting pipe 4, and a connection portion between the second connecting pipe 4 and the opening 17, but the sealing members are not illustrated in FIGS. 2 to 4. The sealing members will be described with reference to FIG. 5.

Figure 5:
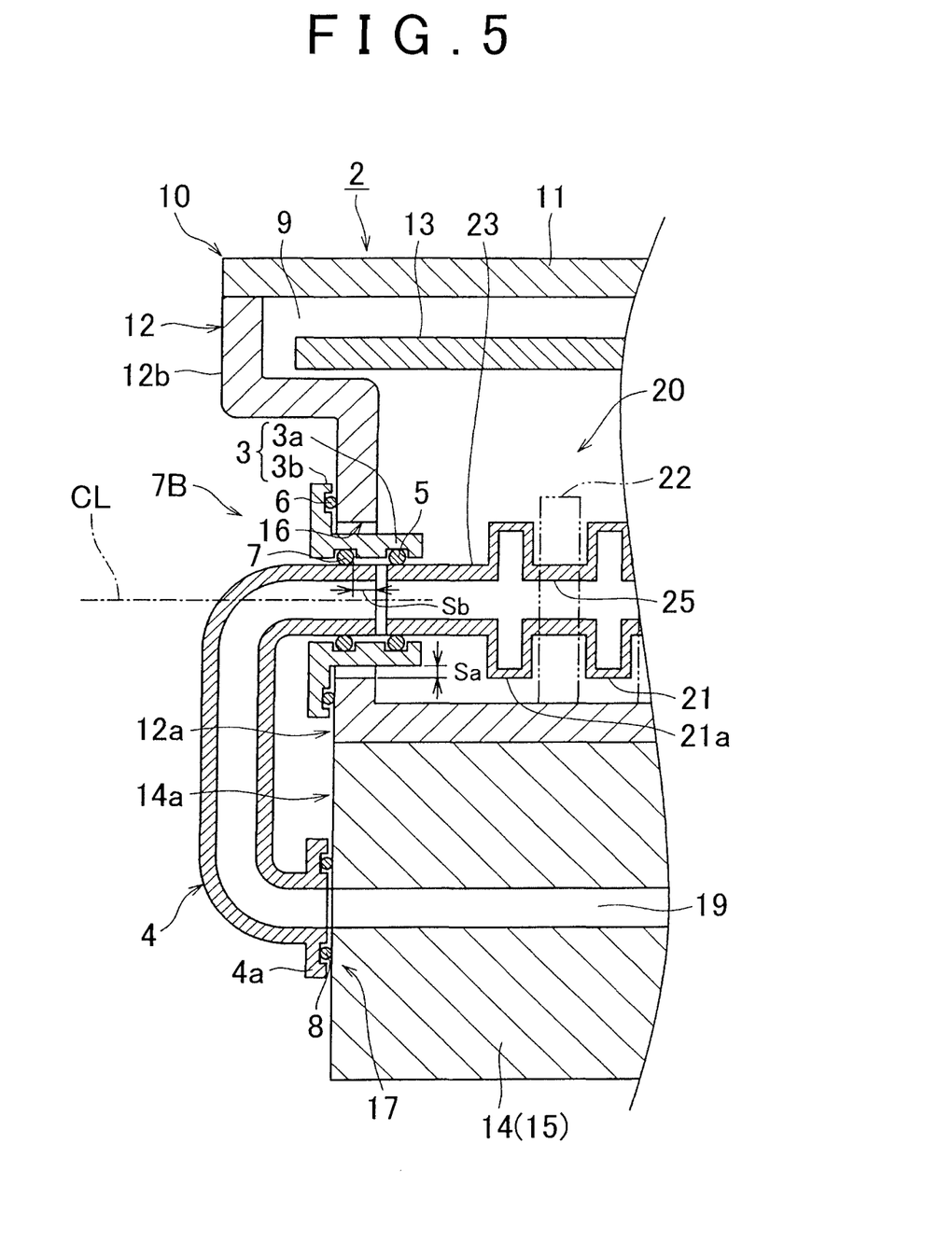
FIG. 5 is an enlarged sectional view of a part 5A in FIG. 4.

Next will be described the first connecting pipe 3 and the second connecting pipe 4 that connect the opening 16 to the opening 17, and connecting structures thereof, with reference to FIG. 5. FIG. 5 illustrates an enlarged view of a part 5A in the section illustrated in FIG. 4, and is a sectional view in a plane including respective center lines of the opening 16 and the opening 17. Note that, in FIG. 5, the power card 22 is illustrated by a virtual line.

One end (a right end of FIG. 5) of the first connecting pipe 3 is fitted to the opening 16 of the first housing 12. The first connecting pipe 3 is constituted by a tubular portion 3a inserted into the opening 16, and a flange portion 3b provided in one end (a left end in FIG. 5) of the tubular portion 3a. A groove is provided on that plane of the flange portion 3b which is opposed to a side surface 12a of the first housing 12 so as to go around the tubular portion 3a in a circumferential direction, and an O-ring 6 is fitted into the groove. When the first connecting pipe 3 is inserted into the opening 16, the O-ring 6 is placed between the flange portion 3b and the side surface 12a, so as to seal a space therebetween in a fluid-tight state. That is, the other end (a left end of the first connecting pipe 3 in FIG. 5) of the first connecting pipe 3 is connected to the opening 16 with a face seal structure. Although not illustrated herein, the flange portion 3b is fixed to the side surface 12a of the first housing 12 via bolts.

The tube 23 of the double-wall construction cooling unit 20 is fitted to an inner side of the tubular portion 3a of the first connecting pipe 3. A groove is provided on the inner side of the tubular portion 3a so as to go around the tubular portion 3a in the circumferential direction, and an O-ring 5 is fitted into the groove. When the tube 23 is inserted into the tubular portion 3a, the O-ring 5 is placed between an inner peripheral surface of the tubular portion 3a and an outer peripheral surface of the tube 23, so as to seal a space therebetween in a fluid-tight state. That is, one end (the right end of the first connecting pipe 3 in FIG. 5) of the first connecting pipe 3 is connected to the tube 23 of the double-wall construction cooling unit 20 with a shaft seal structure.

Further, one end of the second connecting pipe 4 is fitted to the inner side of the tubular portion 3a of the first connecting pipe 3. Another groove is provided on the inner side of the tubular portion 3a so as to go around an inner surface of the tubular portion 3a in the circumferential direction, and an O-ring 7 is fitted into the groove. When one end of the second connecting pipe 4 is inserted into the tubular portion 3a, the O-ring 7 is placed between the inner peripheral surface of the tubular portion 3a and an outer peripheral surface of the second connecting pipe 4, so as to seal a space therebetween in a fluid-tight state. That is, the other end (the left end of the first connecting pipe 3 in FIG. 5) of the first connecting pipe 3 is connected to the one end of the second connecting pipe 4 (an upper-right end of the second connecting pipe 4 in FIG. 5) with a shaft seal structure.

The other end of the second connecting pipe 4 (a lower-right end of the second connecting pipe 4 in FIG. 5) is connected, to the opening 17 of the second housing 14 (that is, the cooler 15). A flange portion 4a is provided in the other end of the second connecting pipe 4, so that the flange portion 4a faces a peripheral area of the opening 17 on a side surface 14a of the second housing 14. A groove is provided on that plane of the flange portion 4a which is opposed to the side surface 14a of the second housing 14 so as to go around the opening 17, and an O-ring 8 is fitted into the groove. When the second connecting pipe 4 is connected to the opening 17, the O-ring 8 is placed between the flange portion 4a and the side surface 14a around the opening 17, so as to seal a space therebetween in a fluid-tight state. That is, the other end of the second connecting pipe 4 is connected to the opening 17 with a face seal structure. Although not illustrated herein, the flange portion 4a is fixed to the side surface 14a of the second housing 14 via bolts.

The first connecting pipe 3 and the second connecting pipe 4 are made from a rigid body. Typically, the first connecting pipe 3 and the second connecting pipe 4 are made from metal such as aluminum, or resin. Further, the O-rings 5, 6, 7, 8 are made from rubber or silicon, for example. Further, the first connecting pipe 3 including the tubular portion and the flange portion 3b at one end thereof corresponds to a bush of a so-called straight pipe.

As illustrated in FIG. 5, a gap or a distance Sa is formed between an outer circumference of the first connecting pipe 3 and an inner circumference of the opening 16. In FIG. 5, the gap or the distance Sa is drawn large exaggeratingly, but, in practice, the gap or the distance Sa may be equivalent to the after-mentioned dimension error. When the gap or the distance Sa is provided as such, the first connecting pipe 3 is movable by the gap or the distance Sa in an in-plane direction including the opening 16 (that is, a direction along the side surface 12a). In the meantime, since the O-ring 6 is sealed by the face seal structure between the first connecting pipe 3 and the opening 16, even if the first connecting pipe 3 moves in the in-plane direction, the fluid-tight state is maintained. Note that the first connecting pipe 3 is fixed to the first housing 12 via bolts. However, a bolt hole provided in the flange portion 3b of the first connecting pipe 3 is larger than a bolt diameter, thereby allowing the flange portion 3b to be displaced.

Further, even if that end of the second connecting pipe 4 which is fitted to the tubular portion 3a of the first connecting pipe 3 moves only by a distance Sb illustrated in FIG. 5, the O-ring 7 is placed between the inner peripheral surface of the tubular portion 3a and the outer peripheral surface of the second connecting pipe 4. That is, the second connecting pipe 4 is movable by the distance Sb in an axis direction of the shaft seal structure (a direction of an axis CL in FIG. 5) while the shaft seal structure by the O-ring 7 is maintained.

As described above, the one end of the second connecting pipe 4 is movable by the gap or the distance Sa in the in-plane direction including the opening 16, or by the distance Sb in the axis direction, while the sealing state with respect to the opening 16 is maintained via the first connecting pipe 3. Accordingly, even if a relative position between the opening 16 and the opening 17 deviates from an originally designed position due to a dimension error or the like, it is still possible to connect these two openings by the first connecting pipe 3 and the second connecting pipe 4 in a reasonable manner. As a result, even if the opening 16 and the opening 17 thus deviating from the originally designed position due to a dimension error or the, like are connected to each other by the first connecting pipe 3 and the second connecting pipe 4, no excessive stress occurs in the connecting pipes 3, 4.

Further, one end of the second connecting pipe 4 having a U-shape is connected to the first connecting pipe 3 by the shaft seal structure, and the other end thereof is connected to the opening 17 by the face seal structure. This allows the one end of the second connecting pipe 4 to move in the axis direction of the shaft seal (the direction of the axis CL in the figure) while maintaining the shaft seal state, and further allows the other end thereof to move in the in-plane direction of the opening (a direction along the side surface 14a in FIG. 5) while maintaining the face seal state. That is, a displacement of a three-dimensional relative position between the opening 16 of the first housing 12 and the opening 17 of the second housing 14 is allowed even solely by the U-shaped second connecting pipe 4. Note that the flange portion 4a of the second connecting pipe 4 is fixed to the second housing 14 via bolts. However, a bolt hole provided in the flange portion 4a is larger than a bolt diameter, thereby allowing the flange portion 4a to be displaced (that is, a displacement of the second connecting pipe 4).

Note that, in the above description, an O-ring is used for sealing of the connecting pipes 3, 4 and the openings 16, 17. In the face seal structure, a planar sealing member may be used instead of the O-ring. In the shaft seal structure, a tubular sealing member may be used instead of the O-ring.

Referring, now to FIGS. 1 to 5, the following describes a projecting shape of a vehicle-front-side upper part of the inverter case 10.

As described above with reference to FIG. 1, the position of the vehicle front side end of the inverter case 10 is generally aligned with the position of the vehicle front side end of the transaxle TA in the vertical direction. More specifically, a projecting portion 12b is formed in an upper part of the inverter case 10 on the vehicle front side (that is, at a position above the first and second connecting pipes 3, 4), and a front side end of the projecting portion 12b is disposed so as to be generally aligned with the front side end of the transaxle TA.

Further, since the inverter case 10 is attached onto the transaxle TA so as to be inclined downward toward the vehicle front side, the front side end of the projecting portion 12b of the inverter case 10 is placed at the vehicle front side relative to the second connecting pipe 4.

As illustrated in FIGS. 2 to 5, the projecting portion 12b is provided in a projecting manner so as to be integrated with an upper part of the vehicle-front side surface 12a of the first housing 12 constituting the inverter case 10. A space 9 is formed inside the case at the projecting portion 12b. An upper part of the space 9 is covered with a front side end of the cover 11. It is possible to dispose the circuit substrate 13 accommodated in the inverter case 10 by use of the space 9 inside the projecting portion 12b. This makes it possible to efficiently accommodate component parts of the inverter 2 to be accommodated in the inverter case 10.

Further, the circuit substrate 13 is generally a lightweight object that is lighter in weight than the other component parts of the inverter. Accordingly, when such a lightweight object is provided at an upper position in the inverter case 10, and a heavy object such as the double-wall construction cooling unit 20 or the like is provided at a lower position therein, it is possible to lower a center of gravity of the inverter 2. As a result, it is possible to reduce vibration acceleration and amplitude of vibration of the inverter case 10 provided on the transaxle TA.

As illustrated in FIG. 5, a projecting width of the projecting, portion 12b of the inverter case 10 from the side surface 12a can be set to generally the same as that of the U-shaped second connecting pipe 4 attached to the inverter 2. However, since the inverter case 10 is provided so as to be inclined downward, the projecting width of the second connecting pipe 4 from the side surface 12a may be large or may be small inversely, provided that the front side end of the projecting portion 12b is placed forward relative to the second connecting pipe 4 in a state where the inverter case 10 is provided as such.

Note that the projecting portion 12b projects with a generally rectangular shape in the present embodiment. However, the projecting portion 12b is not limited to this, and may have other projecting shapes such as a generally trapezoidal shape, a generally triangular shape, and a curved shape.

As such, the projecting portion 12b is formed in the front side upper part of the inverter case 10 to be provided to be inclined downward toward the vehicle front side. Accordingly, in a case where that vehicle component part such as a radiator (not shown) which is placed in front of the inverter case 10 and the transaxle TA so as to be adjacent thereto moves rearward at the time of a front collision of the vehicle, an impact is received by the vehicle component part making contact with the projecting portion 12b of the inverter case 10. As a result, it is possible to restrain such a problem that the second connecting pipe 4 provided on the side surface of the inverter case 10 on the vehicle front side is damaged or that the second connecting pipe 4 penetrates into the inverter case 10.

Further, in the present embodiment, the second connecting pipe 4 is connected to the opening 16 of the inverter case 10 by the shaft seal structure. Accordingly, even if the radiator or the like makes contact with the second connecting pipe 4 at the time of the vehicle front collision, there is room that the second connecting pipe 4 penetrates into the inverter case 10 while maintaining the shaft seal structure. This accordingly yields such an effect that damage of the second connecting pipe 4 and damage of the power cards 22, which are main components of the inverter 2, are restrained at the time of the front collision.

Further, in the present embodiment, the double-wall construction cooling unit 20 configured by laminating the cooling plates 21 and the power cards 22 is supported by the leaf spring 44 in a biasing manner toward the vehicle front side. Accordingly, even if the second connecting pipe 4 is pushed into the case to some extent and abuts with the tube 23, it is possible to absorb a pushing amount by deformation of the leaf spring 44. This also makes it possible to restrain damage of the second connecting pipe 4 and the power cards 22.

Note that the inverter case of the present embodiment has been described above, but the present invention is not limited to the above configuration, and various modification and alternation can be made within a range that is not beyond what is described in Claims of the present application and within its equivalent range.

Figure 6:
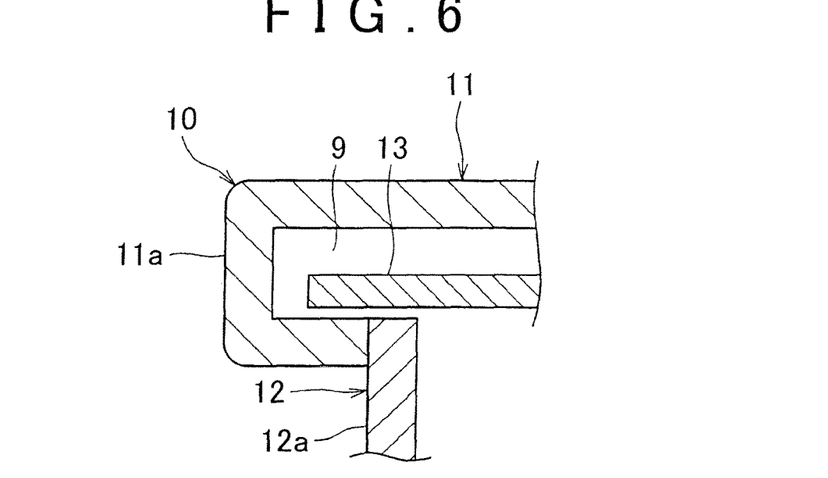
FIG. 6 is a view illustrating a modified embodiment in which a projecting portion is formed by an end part of a cover of the inverter case.

For example, in the above description, the projecting portion 12b is formed on the vehicle-front side surface 12a of the first housing 12 constituting the inverter case 10. However, the present invention is not limited to this, and as illustrated in FIG. 6, a vehicle-front side end of the cover 11 may be formed as a projecting portion 11a having a bending shape projecting more than the side surface 12a of the first housing 12.

Further, the projecting portion of the inverter case may be configured such that a member formed separately from the first housing 12 is fixed to the side surface 12a of the first housing 12 by bolt fixation, welding, adhesion, or the like method.

Figure 7:
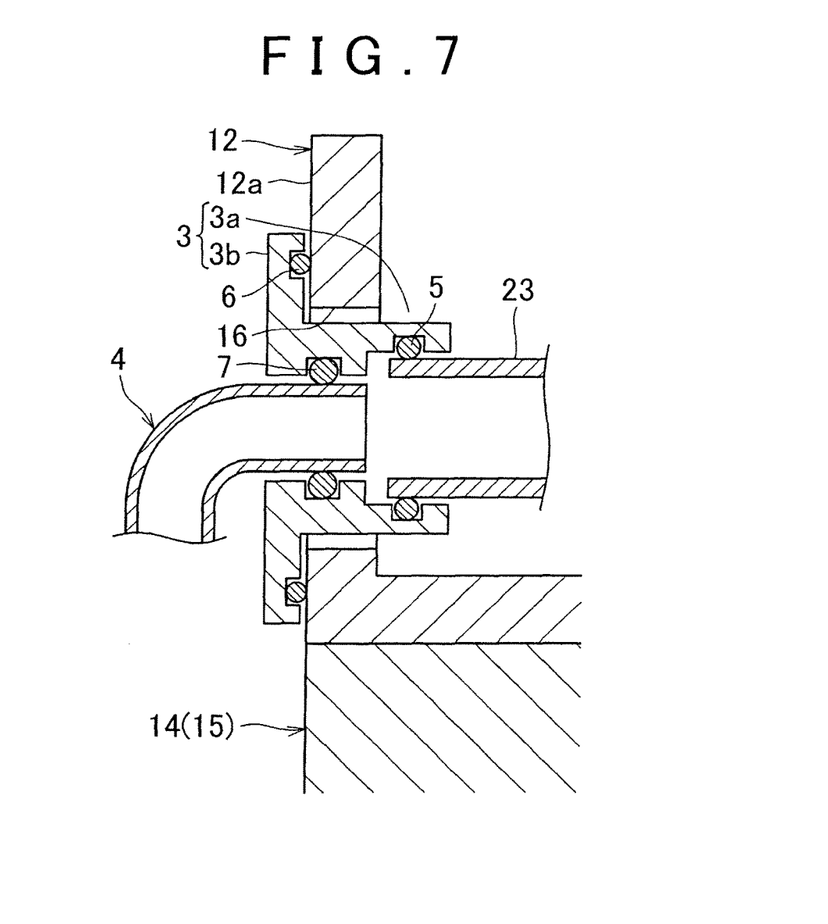
FIG. 7 is a partial enlarged view of a part 7B in FIG. 5, and illustrates a modified embodiment in which an outside diameter of a refrigerant passage pipe connected in a refrigerant passage connection portion is smaller than an inside diameter of a passage pipe inside the case.

In the above description, as illustrated in FIG. 5, that end of the second connecting pipe 4 which is connected to the opening 16 of the first housing 12 via the first connecting pipe 3 with the shaft seal structure is formed from a pipe material having the same outside diameter as the tube 23 extending from the double-wall construction cooling unit 20. However, the present invention is not limited to this. For example, as illustrated in FIG. 7, the outside diameter of the second connecting pipe 4 may be smaller than an inside diameter of the tube 23. With such a configuration, when the second connecting pipe 4 is pushed into the inverter case 10 at the time of a vehicle front collision, the end of the second connecting pipe 4 can penetrate into the tube 23, thereby consequently making it possible to restrain damage of the second connecting pipe 4 (and the double-wall construction cooling unit 20).

The invention claimed is:

1. An inverter case provided on a transaxle of a vehicle so as to be inclined downward toward a front side of the vehicle, the inverter case comprising:
 a refrigerant passage connection portion provided on a front side surface of the inverter case in a longitudinal direction of the vehicle, the refrigerant passage connection portion having a shaft seal structure;
 a refrigerant passage member disposed on the front side surface of the inverter case wherein one end of the refrigerant passage member is connected to the refrigerant passage connection portion by the shaft seal structure, another end of the refrigerant passage member is connected with a face seal structure to an opening on the front side surface of the inverter case, and the refrigerant passage member is configured to introduce, into the inverter case, refrigerant flowing from outside the inverter case, wherein the face seal structure is formed of a flange portion; and
 a projecting portion provided on an upper part of the front side surface of the inverter case, the projecting portion being configured such that a front side end of the projecting portion is placed at the front side of the vehicle relative to a front side end of the refrigerant passage member in the longitudinal direction of the vehicle.

2. The inverter case according to claim 1, wherein:
 an outside diameter of the refrigerant passage member connected to the refrigerant passage connection portion is smaller than an inside diameter of a refrigerant passage pipe provided inside the inverter case and the refrigerant passage pipe is connected to the refrigerant passage connection portion.

3. The inverter case according to claim 1, wherein:
 a position of the front side end of the projecting portion is generally aligned with a position of a front side end of the transaxle when viewed from a vertical direction.

4. The inverter case according to claim 1, further comprising:
 a cooling unit disposed in the inverter case and connected to the refrigerant passage connection portion with the shaft seal structure; and
 a leaf spring biased toward the front side of the vehicle.

* * * * *